(12) United States Patent
Hassun

(10) Patent No.: US 7,215,167 B1
(45) Date of Patent: May 8, 2007

(54) LOW NOISE MICROWAVE FREQUENCY SYNTHESIZER HAVING FAST SWITCHING

(75) Inventor: Roland Hassun, San Mateo, CA (US)

(73) Assignee: Giga-Tronics, Inc., San Ramon, CA (US)

( * ) Notice: Subject to any disclaimer, the term of this patent is extended or adjusted under 35 U.S.C. 154(b) by 0 days.

(21) Appl. No.: 11/414,034

(22) Filed: Apr. 28, 2006

(51) Int. Cl.
*H03L 7/08* (2006.01)

(52) U.S. Cl. .................... 327/158; 331/16; 331/18; 375/365

(58) Field of Classification Search ........ 327/147–149, 327/156–159; 331/16–18, 1 A; 375/365
See application file for complete search history.

(56) References Cited

U.S. PATENT DOCUMENTS

| | | | |
|---|---|---|---|
| 3,928,813 A | 12/1975 | Kingsford-Smith | |
| 4,516,084 A | 5/1985 | Crowley | |
| 4,609,881 A | 9/1986 | Wells | |
| 5,028,887 A | 7/1991 | Gilmore | |
| 5,038,117 A | 8/1991 | Miller | |
| 5,351,014 A | 9/1994 | Ichiyoshi | |
| 5,757,239 A | 5/1998 | Gilmore | |
| 5,859,570 A | 1/1999 | Itoh et al. | |
| 6,198,353 B1 | 3/2001 | Janesch et al. | |
| 6,697,416 B1* | 2/2004 | Jennings | 375/130 |
| 2005/0041766 A1* | 2/2005 | Thompson | 375/376 |

* cited by examiner

*Primary Examiner*—Dinh T. Le
(74) *Attorney, Agent, or Firm*—Menlo Patent Agency LLC; David R. Gildea

(57) ABSTRACT

A frequency synthesizer and a method using a first seed word and a variable clock rate derived from a second seed word for synthesizing a signal frequency. An accumulator accumulates the first seed word at the variable clock rate with a remainder word for updating a reference word at the variable clock rate. The reference word has a most significant bit (MSB) and less significant bits (LSB)s. The remainder word corresponds to the LSBs at overflows of the MSB. A tracking filter filters the MSB for providing a filtered output signal having an output frequency derived from the first seed word and the variable clock rate. The variable clock rate is derived by direct synthesis from the second seed word and single sideband frequency upconversion. The tracking filter can be a phase lock loop with frequency upconversion.

28 Claims, 4 Drawing Sheets

LOW NOISE MICROWAVE FREQUENCY SYNTHESIZER HAVING FAST SWITCHING

BACKGROUND OF THE INVENTION

1. Field of the Invention

The invention relates generally to signal frequency synthesis and more particularly to a frequency synthesizer and a method using a first seed word and a variable clock rate derived from a second seed word for synthesizing a microwave signal frequency.

2. Description of the Background Art

Microwave frequency synthesizers play a crucial role in consumer, industrial and military applications. They are found in test systems for cell phones, radars and communication transceivers.

The performance, cost and size of a synthesizer has a very substantial impact on commercial success and operational viability in numerous instances. Low phase noise, fine frequency resolution, low spurious signal levels and fast switching speed are key performance factors that in the microwave range heretofore could only coexist in costly, physically large and power-hungry products.

Microwave frequency synthesizer architectures fit into 2 broad categories—direct analog and indirect. The direct analog approach is based on the implementation of simple arithmetic operations with components such as mixers, filters, frequency multipliers, frequency dividers, and signal path switches. The resulting solutions have the desired performance, but when applied in the microwave frequency range, are costly, bulky and power consuming.

Indirect synthesis architectures make use low frequency direct digital synthesis and one or more signal-switching-path phase-locked loops (PLL)s. Single switching loop PLL architectures have low cost, small size and low power consumption by virtue of their simplicity. Such simple architectures are used in applications that do not require the level of performance demanded in military and high volume test applications. However, in order to meet a high level of performance, complex solutions having multiple phase-locked loops, sometimes as many as 8 or 10, are required in the signal switching path. As a result, the PLL implementations of frequency synthesizers that are capable of meeting demanding performance are also costly, bulky, and have high power consumption.

Phase noise in synthesized output signals using phase-locked loop architectures is in great part proportional to the ratio of the output frequency of the phase-locked loop to the input (or reference) frequency. Therefore, a high reference frequency is called for. Unfortunately, the high reference frequency makes it difficult to achieve fine frequency resolution. In order to resolve this difficulty while still achieving low phase noise, fractional N and sigma delta systems are used. However, the phase-locked loops for such systems must be relatively narrow in order to prevent spurious signal sidebands. Unfortunately, the narrow phase-locked loops in the signal switching path cause slow switching speed of the output frequency.

An invention is needed for microwave frequency synthesis having the simplicity of a single switching-path loop with the high performance previously only available with direct analog and multi-loop techniques.

SUMMARY OF THE INVENTION

The present invention uses a first seed word and a variable clock signal having a variable clock interpolation rate derived from a second seed word for synthesizing a frequency of an MSB signal, and filters the MSB signal for providing a microwave output signal having an output frequency corresponding to the average of the MSB frequency.

In a preferred embodiment the present invention is a frequency synthesizer apparatus. The apparatus includes an accumulator for accumulating a first seed word at a high variable clock rate with a remainder word for updating a reference word at the high variable clock rate, the reference word having a most significant bit (MSB) and less significant bits (LSB)s, the remainder word corresponding to the LSBs at overflows of the MSB; and a tracking filter for filtering an MSB signal corresponding to the MSB for providing a filtered output signal having an output frequency derived from the first seed word and the high variable clock rate. The apparatus also includes a variable rate clock generator for providing the high variable clock rate at a combination of at least one fixed clock rate and a certain clock interpolation rate, the clock interpolation rate resulting from a second seed word. The tracking filter includes a phase lock loop having an oscillator for providing the output signal, the phase lock loop controlling the output frequency according to a phase difference between a phase of the MSB signal and a phase derived from the output signal.

In another preferred embodiment the present invention is a method for synthesizing a frequency. The method includes steps of accumulating a first seed word at a high variable clock rate with a remainder word for updating a reference word at the high variable clock rate, the reference word having a most significant bit (MSB) and less significant bit (LSB)s; retaining the LSBs at overflows of the MSB as the remainder word; and frequency filtering an MSB signal corresponding to the MSB for providing a filtered output signal having an output frequency derived from the first seed word and the high variable clock rate. The method also includes a step of generating the high variable clock rate at a combination of at least one fixed clock rate and a certain clock interpolation rate where the clock interpolation rate results from a second seed word. The step of frequency filtering the MSB signal includes controlling the output frequency according to a phase difference between a phase of the MSB signal and a phase derived from the output signal.

The invention combines performance features of low phase noise, low spurious levels and fine frequency resolution with fast switching speed.

The invention has the simplicity of having only a single phase lock loop in the signal switching path, thereby providing low cost, small size and low power consumption compared to direct analog synthesis and multi-loop synthesis techniques for the microwave frequency range.

These and other embodiments, objects and advantages of the present invention will on doubt become obvious to those of ordinary skill in the art after viewing the various drawings and reading the following detailed description of the preferred embodiments for carrying out the invention.

BEST MODE FOR CARRYING OUT THE INVENTION

Figure 1:
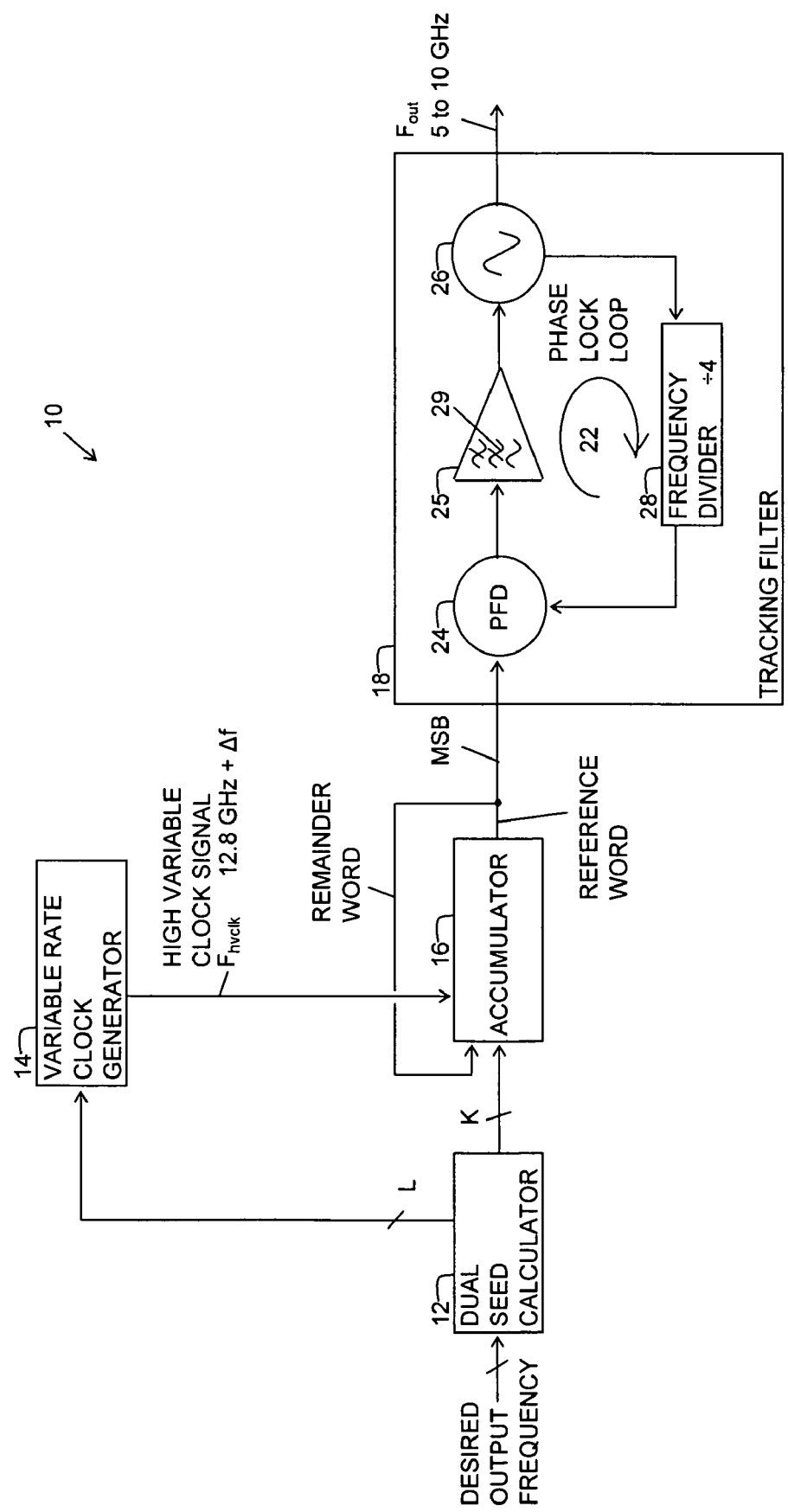
FIG. 1 is a block diagram of a microwave signal frequency synthesizer of the present invention.

The details of the preferred embodiments for carrying out the invention will now be presented. Specific numbers are illustrated in the drawings and described in the detailed descriptions for examples of frequencies, frequency multiplications and frequency divisions. However, it should be understood that the descriptions and illustrations of these details and numerical examples are not intended to limit the invention to these details or numbers. On the contrary the details and numerical examples only describe preferred embodiments for carrying out the idea of the invention. It is expected that alternatives, modifications and equivalents will be apparent to someone skilled in the art as within the scope of this idea.

FIG. 1 is a block diagram of a fast switching frequency synthesizer of the present invention referred to with a reference number 10. The frequency synthesizer 10 includes as major elements a dual seed calculator 12, a variable rate clock generator 14, an accumulator 16 and a tracking filter 18. The dual seed calculator 12 uses a desired output frequency with a lookup table or equations for providing first and second seed words, referred to as K and L, respectively. The variable rate clock generator 14, accumulator 16 and tracking filter 18 operate at microwave frequencies for synthesizing a microwave output frequency for an output signal.

The details of the preferred embodiments are shown by the figures and accompanying descriptions for providing an output signal in the microwave frequency range. It is appreciated by those skilled in the art that available components and parasitic effects are more limiting for microwave frequencies than for lower frequencies. Therefore, ideas that have been developed for lower frequencies are not necessarily relevant to the microwave art of the present invention. The microwave frequency range is considered to be frequencies greater than one Gigahertz (GHz) up to at least one hundred GHz.

The variable rate clock generator 14 uses the second seed word L from the dual seed calculator 12 for providing a high variable clock signal at a high variable clock rate Fhvclk. The clock rate Fhvclk is equal to a high fixed clock rate Fhclk and a certain clock interpolation rate $\Delta f$. The high fixed clock rate Fhclk may be the fixed rate of a single high fixed clock signal or a combination of fixed rates of several fixed clock signals that add or subtract to combine to the high fixed clock rate Fhclk. In an exemplary embodiment the high variable clock rate Fhvclk is 12.8 GHz+$\Delta f$ where the clock interpolation rate $\Delta f$ either adds or subtracts from a high fixed clock rate Fhclk of 12.8 GHz within a maximum rate variation range of $\pm \Delta F$.

The high fixed clock rate Fhclk may be provided by a high fixed clock signal at 12.8 GHz or a combination of clock signals where the sums or differences of the rates of the clock signals combine to 12.8 GHz. In an exemplary combination an intermediate fixed clock signal having a rate Ffclk at 800 MHz and an offset high fixed clock signal having a rate Foclk at 12.0 GHz are summed for providing the high fixed clock rate Fhclk of 12.8 GHz.

The accumulator 16 uses the high variable clock signal from the variable rate clock generator 14 with the first seed word K for providing a reference word. The accumulator 16 has a predetermined modulus $2^M$ herein called a high modulus. The reference word has bit length of M having a most significant bit (MSB) and less significant bits (LSB)s. In operation, the accumulator 16 starts a cycle with an accumulation value of a remainder word comprised of the LSBs of the reference word.

At each cycle of the high variable clock signal the accumulator 16 adds (accumulates) the first seed word K to the accumulation value. The first seed word K is accumulated several times on top of the previous accumulation value until the accumulation value reaches or exceeds the value of the high modulus $2^M$. When the value of the high modulus $2^M$ is reached or exceeded the MSB of the reference word overflows. At the MSB overflow, the remainder word becomes the accumulation value and the cycle is begins again. The frequency of the MSB reference signal is the overflow rate of the MSB.

The accumulator 16 adds the first seed word K to itself (the reference word) indefinitely at the stroke of the high variable clock signal. When the accumulated sum (reference word) reaches a value that exceeds the exponential modulus capacity $2^M$ of the accumulator 16, the accumulation value (reference word) starts over from the last remainder word (LSBs of the reference word). This functionality yields a signal having steps at the high variable clock rate Fhvclk. The MSB frequency is proportional to the high variable clock rate Fhvclk and the size of the word (the first seed word K) being accumulated and inversely proportional to the high modulus $2^M$. The MSB overflows at an average rate or frequency equal to the high variable clock rate Fhvclk times the first seed word K divided by the high modulus $2^M$.

The largest value that the first seed word K can take is slightly less than one-half the high modulus $2^M$. This means that the average MSB overflow frequency or rate has a range of Fhvclk divided by the high modulus $2^M$ (for K=1) to slightly less than one-half of Fhvclk (for K slightly less than $\frac{1}{2} \times 2^M$). A model MX1DS10P from Centellax, Inc. of Santa Rosa, Calif., can be used in the construction of such accumulator 16.

The MSB is passed from the accumulator 16 to the tracking filter 18 in the form of an MSB reference signal, or simply MSB signal, having a frequency and phase corresponding to the changes of the MSB of the reference word. The MSB signal may be the MSB bit having alternate high and low states or a pulse triggered by a transition of the MSB bit. The pulse may be triggered when the MSB overflows (transitions from a high to a low state) or when the MSB increments (transitions from a low to a high state). The tracking filter 18 may be constructed to react to the central energy of the MSB signal, or to a high to low transition of the MSB signal, or a low to high transition of the MSB signal, or a combination of the high to low and low to high transitions.

The tracking filter 18 receives the MSB signal and applies a bandpass frequency filter that tracks the average frequency of the MSB overflows (or a multiple of that frequency) in order to greatly reduce the levels of undesired spurious frequencies. Such tracking filter 18 can be constructed with tunable resonant material such as bulk Yttrium Iron Garnet (YIG) or device such as a varactor diode that is tuned with a voltage derived from the first and second seed words K and L to resonate at the average MSB overflow frequency. However, the tracking filter 18 of the present invention is implemented using phase lock loop 22 using the MSB signal as a reference signal.

The phase lock loop 22 includes a phase frequency detector (PFD) 24, an error amplifier 25, a voltage controlled oscillator (VCO) 26 and a frequency divider 28. The output signal frequency from the VCO 26 is controlled with a voltage provided by the error amplifier 25. The error amplifier 25 provides the control voltage by amplifying an error voltage from the PFD 24 with an amplification factor that may be shaped according to the control voltage and a known voltage-to-frequency characteristic of the VCO 26. The VCO 26 can use YIG material, a varactor diode or capacitance of a transistor junction as a voltage tunable resonator.

The error amplifier 25 includes a loop filter 29 for providing stability compensation elements for adding poles and zeroes to the open loop response of the phase lock loop 22 in order to increase the order of the loop 22 and to prevent oscillations of the loop 22. The loop filter 29 bandwidth must be low enough to filter the close-in spurious sideband signals from the phase steps of the reference signal and low enough so that multiplied wide band phase noise in the reference signal is prevented from modulating the VCO 26. The loop filter 29 must be high enough so that the close-in phase noise of the output signal is no more than the multiplied close-in phase noise of the reference signal and high enough to allow fast switching between output frequencies. The term "close-in" refers to spectral difference with respect to the output frequency.

The PFD 24 uses exclusive-or gates for comparing phase and frequency of the MSB signal to phase and frequency of a feedback signal from the frequency divider 28. In a preferred embodiment the PFD 24 reacts to the negative transition (1 to 0) of the MSB when the MSB overflows. When the frequencies are not equal the PFD 24 provides the error voltage to the error amplifier 25 to drive the VCO 26 until the frequencies are equal. When the frequencies are equal, the PFD 24 provides the error voltage to the error amplifier 25 to control the VCO 26 to minimize the phase difference between the MSB signal and the feedback signal.

The frequency divider 28 divides the output signal frequency by a factor C for providing the feedback signal having a frequency of 1/C of the output signal frequency. Because the PFD 24 compares the MSB overflow frequency to a frequency that is 1/C of the output frequency, the phase lock loop 22 effectively multiplies the MSB frequency by the factor C. In a preferred embodiment, the factor C is fixed. For lower cost the factor C is preferred as an integer power of two. The output frequency may be 5 to 10 GHz, the fixed factor C may be four and the MSB overflow frequency may be 1.25 to 2.5 GHz. Two divide-by-two frequency dividers can be used to implement the divide factor C of four.

The MSB cycle has the precise average frequency that is desired for the reference signal input to the phase lock loop 22, but the spectrum of the MSB signal includes spurious signals around the desired frequency. The phase lock loop 22 filters the spurious signals by an amount determined by the spectral (frequency) separation ΔSS between the desired frequency and the spurious frequency; and the filtering action from the bandwidth of the closed loop response of the phase lock loop 22. The loop filter 29 primarily determines this bandwidth. In a preferred embodiment the bandwidth is about three MHz. The spectral separation ΔSS and the bandwidth are judicially designed so that the spectral separation ΔSS is about five to ten times the bandwidth.

Figure 2:
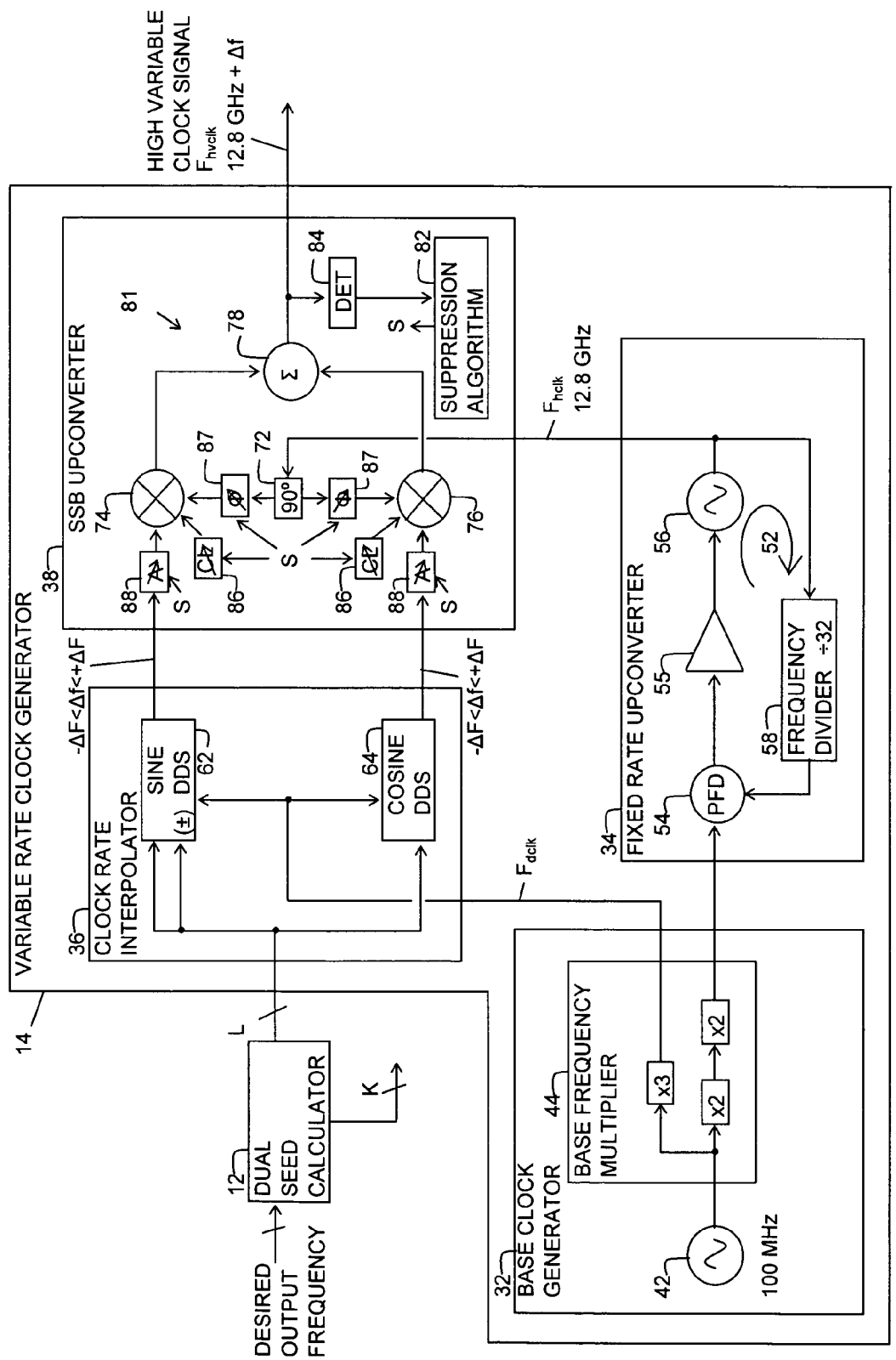
FIG. 2 is a block diagram of a variable clock generator of the frequency synthesizer of FIG. 1.

FIG. 2 is a block diagram of the variable rate clock generator 14 of the present invention. The variable rate clock generator 14 includes a base clock generator 32, a fixed rate upconverter 34, a clock rate interpolator 36 and a single sideband (SSB) upconverter 38.

The base clock generator 32 includes a reference oscillator 42 and a base frequency multiplier 44. The frequency multiplier 44 passes a dds fixed clock signal at a dds fixed clock rate Fdclk to the clock rate interpolator 36 and passes a base fixed clock signal to the rate upconverter 34. In a preferred embodiment the reference oscillator 42 operates with a crystal resonator at 100 MHz for providing a base reference signal. The frequency multiplier 44 multiplies the frequency of the base reference signal by three for providing the dds fixed clock signal at a dds fixed clock rate Fdclk of 300 MHz. The multiplication-by-three frequency is conveniently obtained with diode rectifiers or by amplifying and limiting the base reference signal.

The frequency multiplier 44 twice doubles the frequency of the base reference signal for providing the base fixed clock signal at a fixed rate of 400 MHz. Diode rectifiers may be used for doubling the frequencies. Depending upon the availability of higher speed components for the clock rate interpolator 36, the dds fixed clock signal may be split off from the base fixed clock signal for providing a dds fixed clock rate Fdclk of 400 MHz, and the frequency multiplication-by-three may be eliminated.

The fixed rate upconverter 34 receives the base fixed clock signal and provides a high fixed clock signal having the high fixed clock rate Fhclk. Such rate upconverter 34 can be constructed with diode doublers or rectifiers. However, in the present invention the rate upconverter 34 uses a phase lock loop 52 including a phase frequency detector (PFD) 54, an error amplifier 55, a voltage controlled oscillator (VCO) 56 and a frequency divider 58. The high fixed clock rate Fhclk of the output signal from the VCO 56 is controlled with a voltage provided by the error amplifier 55.

The error amplifier 55 provides the control voltage by amplifying an error voltage from the PFD 54 with an amplification factor that may be shaped according to the control voltage and a known voltage-to-frequency characteristic of the VCO 56. The error amplifier 55 also includes loop stability compensation elements for adding poles and zeroes to the open loop response of the phase lock loop 52 in order to increase the order of the loop 52 and to prevent oscillations of the loop 52.

The PFD 54 compares phase and frequency of the base fixed clock signal to phase and frequency of a feedback signal from the frequency divider 58. When the frequencies are equal, the PFD 54 provides the error voltage to the error amplifier 55 to control the VCO 56 to minimize the phase difference between the base fixed clock signal and the feedback signal.

The frequency divider 58 divides the high fixed clock rate Fhclk by a factor for providing the feedback signal. Because the PFD 54 compares the frequency of the base fixed clock signal to a divided frequency, the operation of the phase lock loop 52 effectively multiplies the frequency of the base fixed clock signal by the divide factor for providing the high fixed clock rate Fhclk. In a preferred embodiment, the divide factor is fixed. For lower cost the divide factor is preferred as an integer power of two. A divide factor of thirty-two is used in an exemplary embodiment. A divide-by-sixteen followed by a divide-by-two can be used to implement the divide factor of thirty-two.

The clock rate interpolator 36 includes an IQ direct digital synthesizer including a sine DDS 62 and a cosine DDS 64. The first bit of the second seed word L determines the +sign of the output signal (0 or 180°) of the sine DDS 62, thereby providing a plus and minus variable interpolation rate Δf. The sine DDS 62 and the cosine DDS 64 use the remaining bits of the second seed word L with the dds fixed clock signal for providing I and Q components of a baseband variable clock signal having the clock interpolation rate Δf within the maximum range of 0±ΔF. The clock interpolation rates Δf of 0 to −ΔF are provided with the 180° phase shift of the output of the sine DDS 62.

The frequency resolution of the synthesizer 10 is (Fdclk/$2^{Md}$)×(Fout/Fhvclk). The number Md is the lower of the number of bits of resolution for the second seed word L and the number of bits of resolution for the sine DDS 62 and cosine DDS 64. For a preferred sine DDS 62 and cosine DDS 64 using a model AD9854 from Analog Devices, Inc., of Norwood, Mass., the number of bits Md is forty-eight.

The single sideband (SSB) upconverter 38 uses an IQ modulator for upconverting the I (in phase) and Q (quadrature phase) components of the baseband variable clock signal to the high variable clock signal having the high variable clock rate Fhvclk having the clock interpolation rate Δf. The SSB converter IQ modulator 38 includes a quadrature splitter 72, I and Q mixers 74 and 76, and a combiner 78. The quadrature splitter 72 splits the high fixed clock signal into I and Q components.

The I mixer 74 multiplies the I component of the high fixed clock signal times the I component of the baseband variable clock signal for providing an I component of the high variable clock signal. Similarly, the Q mixer 76 multiplies the Q component of the high fixed clock signal times the Q component of the baseband variable clock signal for providing a Q component of the high variable clock signal. The combiner 78 combines the I and Q components for providing the high variable clock signal to the accumulator 16.

The multiplication process in the I and Q mixers 74 and 76 provides double sideband outputs (the sum and difference frequencies of the high fixed clock rate Fhclk and the baseband variable clock rate Δf). However, the quadrature phasing in the IQ modulation acts to cancel one of the sidebands and reinforce the other for providing signal sideband upconversion when the I and Q components are combined by the combiner 78.

The IQ modulator for the SSB upconverter 38 also includes a suppression network 81 including a software suppression algorithm 82 for further suppressing the frequency upconversion of the unwanted double sideband and suppressing carrier energy leakage (also known as carrier feedthrough). The carrier leakage is the feedthrough of the I and Q components of the high fixed clock signal into the I and Q components of the high variable clock signal. Importantly, the SSB upconverter 38 operates only over a narrow output frequency range (Fhclk±ΔF), thereby enabling a single set of compensation values to provide sufficient suppression over the entire output frequency in order to enable fast frequency switching without re-calibration. Alternatively, individual sets of calibration constants can be stored and then used for each frequency of the high variable clock signal.

The suppression network 81 includes hardware for a scalar detector 84 and hardware compensation circuitry including a carrier leak (CL) compensator 86, an IQ quadrature adjuster 87 and an IQ ratio adjuster 88. The scalar detector 84 detects sequential scalar amplitudes of the high variable clock signal. A diode detector can be used. Neither phase nor simultaneous quadrature information is necessarily detected by the scalar detector 84 or available to the suppression algorithm 82.

The carrier leak compensator 86 has separate I and Q compensators connected to the I and Q mixers 74 and 76. The I and Q compensators 86 are independently controlled by the suppression algorithm 82 to push or pull small direct (DC) currents into the I and Q mixers 74 and 76 in order to compensate or balance the I and Q mixers 74 and 76 so that the I and Q high fixed clock signals do not appear superimposed on the I and Q components of the high variable clock signal.

The quadrature adjuster 87, under control of the suppression algorithm 82, adjusts the 90° phase split for the I and Q components of the high fixed clock signal to the I and Q mixers 74 and 76 in order to minimize the unwanted upconversion sideband. A circuit using a varactor diode can be used. Only one quadrature adjuster 87 is required—either on the I side or the Q side. However, because of second order and parasitic effects at microwave frequencies, the symmetry of having adjusters on both the I side and the Q side may be desired for better performance.

The ratio adjuster 88, under control of the suppression algorithm 82, adjusts the amplitude ratio of the I and Q components of the baseband variable clock signal in order to minimize the unwanted upconversion sideband. In an alternative embodiment, the ratio adjustment may be implemented on the I and Q components of the high variable clock signal. Only one ratio adjuster 88 is required—either on the I side or the Q side. However, because of second order and parasitic effects at microwave frequencies, the symmetry of having adjusters on both the I side and the Q side may be desired for better performance.

The suppression algorithm 82 uses sequential scalar amplitude measurements of the high variable clock signal by the detector 84 for calculating and then controlling adjustments made by the carrier leak compensator 86 the quadrature 87 and the ratio adjustor 88 in a calibration operation performed before the normal operation or upon request of a user. Further details of a suppression network that may be adapted to the SSB upconverter 38 of the present invention may be found in U.S. Pat. No. 4,717,894 "Calibration of Vector Modulators Using a Scalar Detector" by Edwards et al and incorporated herein by reference.

Figure 3:
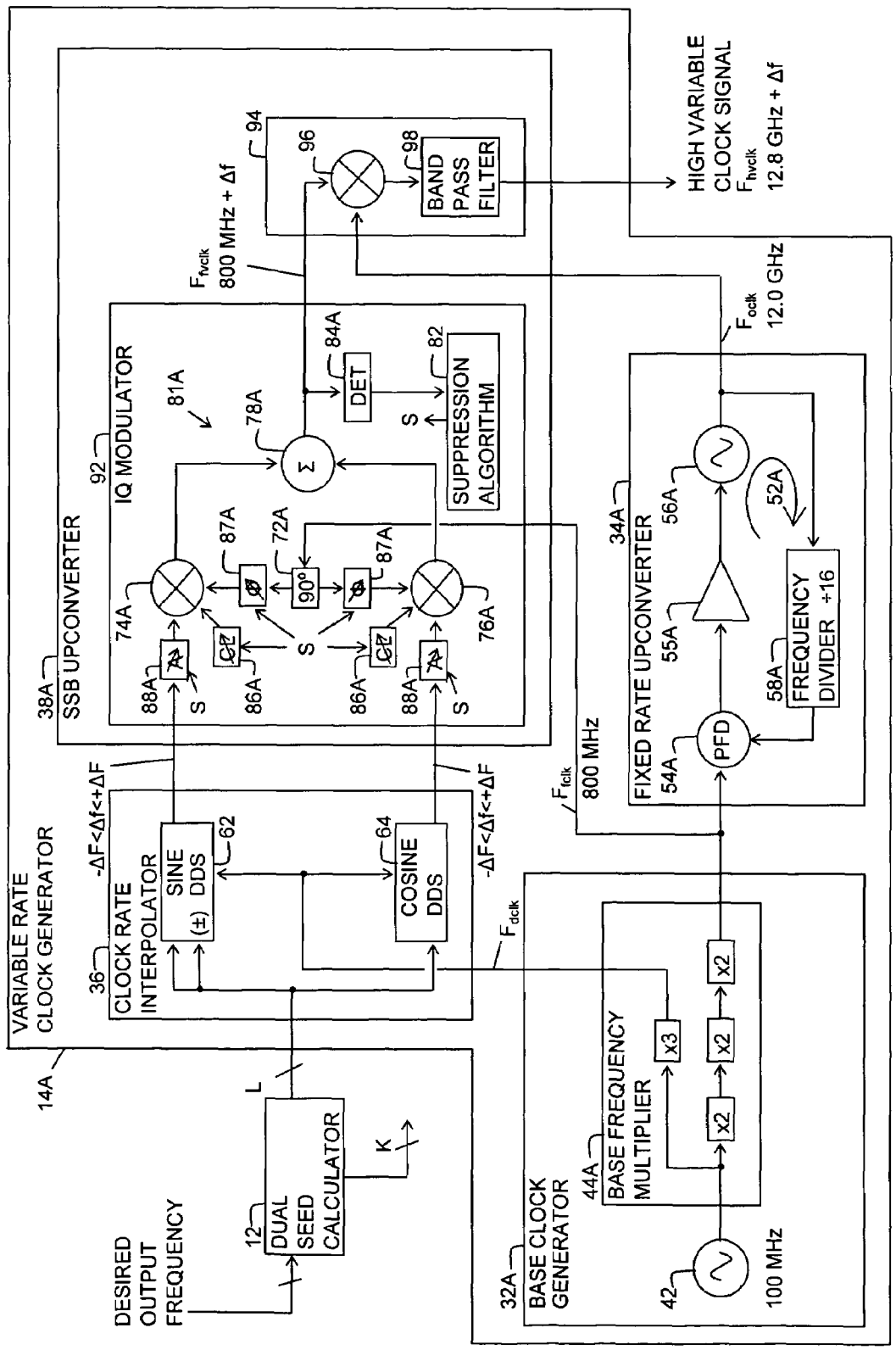
FIG. 3 is an alternative block diagram of a variable clock generator of the frequency synthesizer of FIG. 1.

FIG. 3 is an alternative block diagram of the variable rate clock generator 14 of the present invention where the alternative variable rate clock generator is referred to by a reference identifier 14A. The variable rate clock generator 14A differs from the variable rate clock generator 14 by upconverting the baseband variable clock signal in two stages.

The variable rate clock generator 14A includes a base clock generator 32A, a fixed rate upconverter 34A, the clock rate interpolator 36 and a single sideband (SSB) upconverter 38A. The base clock generator 32A includes the reference oscillator 42 and a base frequency multiplier 44A. The frequency multiplier 44A passes the dds fixed clock signal at the dds fixed clock rate Fdclk to the clock rate interpolator 36 and passes an intermediate fixed clock signal at an intermediate fixed clock rate Ffclk to the rate upconverter 34A and the SSB upconverter 38A. In a preferred embodiment the reference oscillator 42 operates with a crystal resonator at 100 MHz for providing a base reference signal. The frequency multiplier 44A multiplies the frequency of the base reference signal by three for providing the dds fixed clock signal at a dds fixed clock rate Fdclk of 300 MHz.

The frequency multiplier 44A doubles the frequency of the base reference signal three times for providing the intermediate fixed clock signal at an intermediate fixed clock rate Ffclk of 800 MHz. Depending upon the availability of higher speed components for the clock rate interpolator 36, the dds fixed clock signal may be split off after the second or third frequency doubler for providing dds fixed clock rates Fdclk of 400 MHz or 800 MHz, respectively.

The fixed rate upconverter 34A receives the intermediate fixed clock signal and provides an offset high fixed clock signal having an offset high fixed clock rate Foclk. It should be noted that the sum of the offset high fixed clock rate Foclk and the intermediate fixed clock rate Ffclk is equal to the high fixed clock rate Fhclk. In an exemplary embodiment the offset high fixed clock rate Foclk is 12.0 GHz. Such rate upconverter 34A can be constructed with diode doublers or rectifiers. However, in the present invention the rate upconverter 44A uses a phase lock loop 52A including a phase frequency detector (PFD) 54A, an error amplifier 55A, a voltage controlled oscillator (VCO) 56A and a frequency divider 58A. The offset high fixed clock rate Foclk of the output signal from the VCO 56A is controlled with a voltage provided by the error amplifier 55A.

The error amplifier 55A provides the control voltage by amplifying an error voltage from the PFD 54A with an amplification factor that may be shaped according to the control voltage and a known voltage-to-frequency characteristic of the VCO 56A. The error amplifier 55A also includes loop stability compensation elements for adding poles and zeroes to the open loop response of the phase lock loop 52A in order to increase the order of the loop 52A and to prevent oscillations of the loop 52A.

The PFD 54A compares phase and frequency of the intermediate fixed clock signal to phase and frequency of a feedback signal from the frequency divider 58A. When the frequencies are equal, the PFD 54A provides the error voltage to the error amplifier 55A to control the VCO 56A to minimize the phase difference between the intermediate fixed clock signal and the feedback signal.

The frequency divider 58A divides the offset high fixed clock rate Foclk by a factor for providing the feedback signal. Because the PFD 54A compares the frequency Ffclk of the intermediate fixed clock signal to a divided frequency, the operation of the phase lock loop 52A effectively multiplies the frequency Ffclk of the intermediate fixed clock signal by the divide factor for providing the offset high fixed clock rate Foclk. In a preferred embodiment, the divide factor is fixed. For lower cost the divide factor is preferred as an integer power of two. A divide factor of sixteen is used for an exemplary embodiment. A divide by eight followed by a divide by two can be used to implement the divide factor of sixteen.

The clock rate interpolator 36, as described above, provides I and Q components of the baseband variable clock signal having the clock interpolation rate $\Delta f$ within the maximum range of $\pm \Delta F$. The clock rate interpolator 36 passes the baseband variable clock signal to the single sideband (SSB) upconverter 38A.

The SSB upconverter 38A includes an IQ modulator 92 and a high offset upconverter 94. The IQ modulator 92 operates in a similar manner to the SSB upconverter IQ modulator 38 described above with the difference that the IQ modulator 38 described above operates at the high fixed clock rate Fhclk whereas the IQ modulator 92 operates at a lower intermediate fixed clock rate Ffclk. The IQ modulator 92 provides an intermediate variable clock signal at an intermediate variable clock rate Ffvclk having the clock interpolation rate $\Delta f$ about the intermediate fixed clock rate Ffclk.

The IQ modulator 92 includes a quadrature splitter 72A, I and Q mixers 74A and 76A, and a combiner 78A. The quadrature splitter 72A splits the intermediate fixed clock signal into I (in phase) and Q (quadrature phase) components. The I mixer 74A multiplies the I component of the intermediate fixed clock signal times the I component of the baseband variable clock signal for providing an I component of the intermediate variable clock signal. Similarly, the Q mixer 76A multiplies the Q component of the intermediate fixed clock signal times the Q component of the baseband variable clock signal for providing a Q component of the intermediate variable clock signal. The combiner 78A combines the I and Q components for providing the intermediate variable clock signal to the high offset upconverter 94.

The multiplication processes in the I and Q mixers 74A and 76A provide double sideband outputs (the sum and difference of the high fixed clock rate and the baseband variable clock rate). However, the quadrature phasing in the IQ modulation acts to cancel one of the sidebands and reinforce the other for providing signal sideband upconversion when the I and Q components are combined by the combiner 78A.

The IQ modulator 92 includes a suppression network 81A having the software suppression algorithm 82 described above, and the hardware components for a scalar detector 84A, a carrier leak (CL) compensator 86A, an IQ quadrature adjuster 87A and an IQ ratio adjuster 88A operating at the intermediate fixed clock rate Ffclk in a similar manner the scalar detector 84, the carrier leak compensator 86, the IQ quadrature adjuster 87 and the IQ ratio adjuster 88 described above for the IQ modulator 38.

The high offset upconverter 94 includes a mixer 96 and a band pass filter 98. The mixer 96 mixes the intermediate variable clock signal with the offset high fixed clock signal for providing an output signal to the band pass filter 98. The band pass filter 98 filters the unwanted upconversion sideband of the mixer output signal for providing the high variable clock signal at the high variable clock rate Fhvclk having the clock interpolation rate $\Delta f$. The high variable clock signal is passed to the accumulator 16. In an variation of this embodiment, the detector 84A may be disposed for detecting the amplitude of the high variable clock signal after the band pass filter 98.

Figure 4:
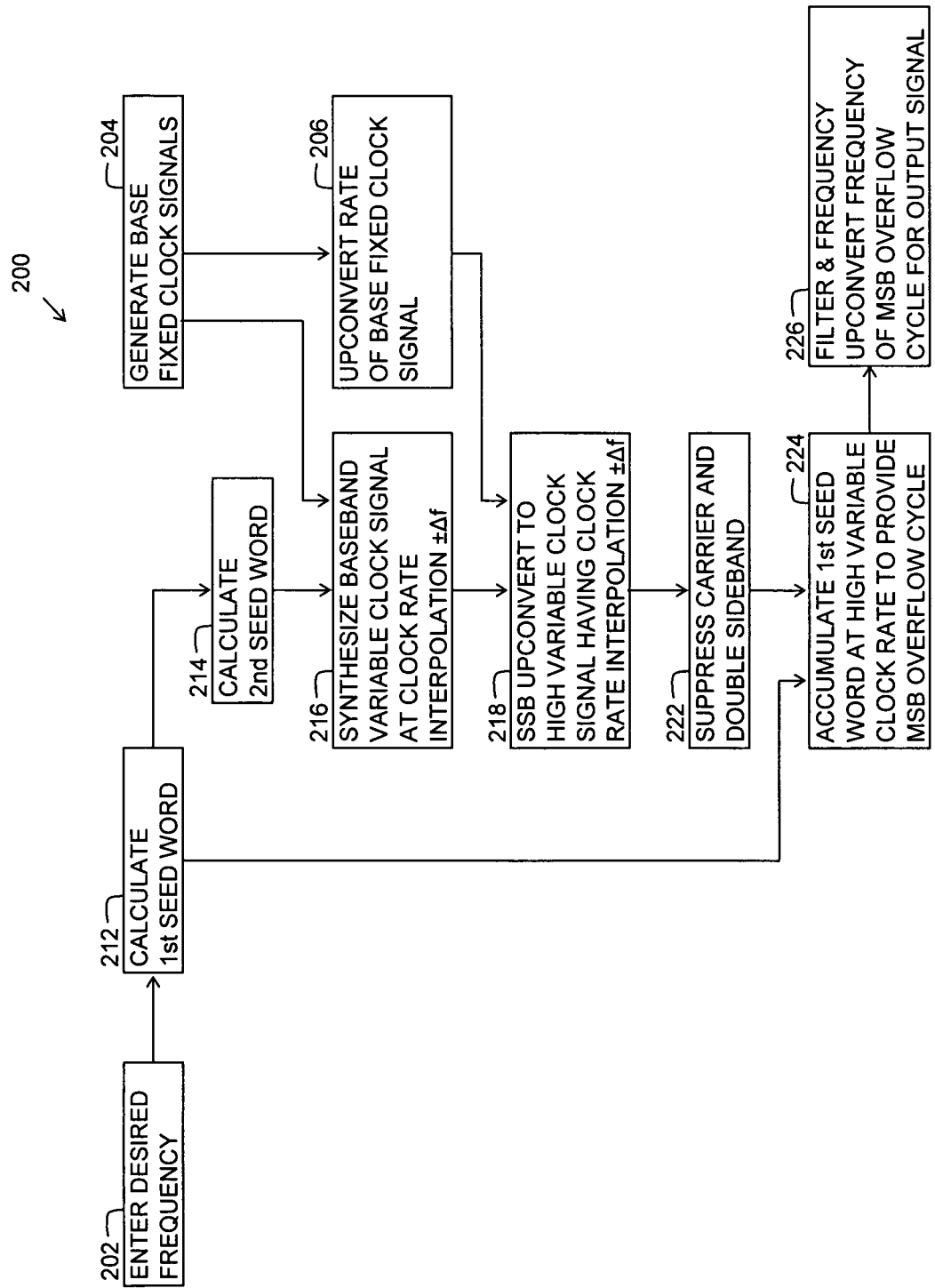
FIG. 4 is a flow chart of a method of the present invention for synthesizing a microwave signal frequency.

FIG. 4 is a flow chart of a method of the present invention for synthesizing a desired frequency of an output signal. A tangible medium 200 may be constructed as an article of manufacture that contains a set of instructions in a form that is readable by a computer for causing the computer to carry out one or more steps of this method. The computer may take the form of a frequency synthesizer for reading the instructions and controlling the elements of the frequency synthesizer for synthesizing a desired output frequency.

At a start 202, a human user or a computer through a digital interface enters the desired output frequency. One or more base or intermediate fixed clock signals are generated from a reference oscillator signal in a step 204. A separate dds fixed clock signal at a dds fixed clock rate Fdclk may also be generated from the reference oscillator signal.

In a step 206 a base reference signal is frequency upconverted to the high fixed clock rate Fhclk. In an alternative embodiment a base reference signal is frequency upconverted to an intermediate fixed clock rate Ffclk and then further upconverted to the offset high fixed clock rate Foclk where the sum (or difference) of the intermediate fixed clock rate Ffclk and the offset high fixed clock rate Foclk equals the high fixed clock rate Fhclk.

The first seed word K is looked up in a table or calculated from a desired output frequency Fout in a step 212. The calculation for determining the lookup table or a real time calculation of the first seed word K is based on a predetermined incremental resolution $\Delta K$ of the first seed word K, the high fixed clock rate Fhclk, the high modulus $2^M$ of the accumulator 16, and the frequency upconversion ratio C from the MSB cycle frequency to the output frequency Fout.

The second seed word L is looked up in a table or calculated in a step 214 from the desired output frequency Fout. The calculation for determining the lookup table or a real time calculation for the second seed word L is based on the first seed word K, the high fixed clock rate Fhclk, a dds fixed clock rate Fdclk for clocking the sine and cosine direct digital synthesis (DDS) signals, a base modulus $2^{Mb}$ for the sine and cosine DDS signals, the high modulus $2^M$ of the accumulator 16, and the frequency upconversion ratio C from the MSB cycle frequency to the output frequency Fout. The baseband variable clock signal at the clock interpolation rate Δf is generated in a step 216 from the second seed word L, the dds fixed clock rate Fdclk, and the base modulus $2^{Mb}$. The baseband variable clock signal has an I component and a Q component.

The baseband variable clock signal at the clock interpolation rate Δf is single sideband (SSB) frequency upconverted in a step 218 using the high fixed clock signal to the high variable clock signal at the high variable clock rate Fhvclk. The high variable clock rate Fhvclk differs from the high fixed clock rate Fhclk by the clock interpolation rate Δf. The single sideband upconversion of the I and Q components of the baseband variable clock signal is accomplished by IQ modulating the I and Q components of the high fixed clock signal with the I and Q components, respectively, of the baseband variable clock signal.

In an alternative embodiment the baseband variable clock signal at the clock interpolation rate Δf is single sideband (SSB) frequency upconverted in the step 218 using an intermediate fixed clock signal to the intermediate variable clock signal at the intermediate variable clock rate Ffvclk. The intermediate variable clock rate Ffvclk differs from the intermediate fixed clock rate Ffclk by the clock interpolation rate Δf. The single sideband upconversion of the I and Q components of the baseband variable clock signal is accomplished by IQ modulating the I and Q components of the intermediate fixed clock signal with the I and Q components, respectively, of the baseband variable clock signal. Then, the intermediate variable clock signal is multiplies by with the offset high fixed signal at the offset high fixed rate Foclk and the multiplied output is bandpass filtered for providing the high variable clock signal at the high variable clock rate Fhvclk.

In a step 222 as a part of the IQ modulation for the single sideband upconversion, scalar amplitudes of the high (or intermediate) variable clock signal are detected and used for calculating compensation for reducing spurious signals on the high (or intermediate) variable clock signal. The compensation is used for driving circuitry for suppressing the feedthrough of the high (or intermediate) fixed clock signal and suppressing the unwanted frequency upconversion product by adjusting the quadrature relationship of the I and Q components of the high (or intermediate) fixed clock signal and adjusting the amplitude ratio of the I and Q components of the high (or intermediate) variable clock signal.

The first seed word K is accumulated in a step 224 at the high variable clock rate Fhvclk with the remainder word for updating the reference word at the high variable clock rate Fhvclk. The reference word has a most significant bit (MSB) and less significant bit (LSB)s. The LSBs at overflows of the MSB are used as the remainder word.

Then, in a step 226 the frequency and phase of the MSB signal are compared to a frequency and phase of a feedback signal derived from the frequency and phase of the output signal. The output signal frequency Fout is frequency divided by a factor C for providing the feedback signal. The frequency division in the feedback causes the frequency of MSB signal to be multiplied by the factor C for providing the output signal frequency Fout.

The names of the various clock signals and clock rates and preferred numerical embodiments for the clock rates are shown in a table 1, below.

TABLE 1

| |
|---|
| clock interpolation rate Δf, −ΔF ≦ Δf ≦ ΔF |
| baseband (IQ) variable clock signal |
| baseband (IQ) variable clock rate Δf |
| base reference signal |
| base reference frequency, 100 MHz |
| dds fixed clock signal |
| dds fixed clock rate Fdclk, 300 MHz |
| base fixed clock signal |
| base fixed clock rate, 400 MHz |
| intermediate fixed clock signal |
| intermediate fixed clock rate Ffclk, 800 MHz |
| intermediate (SSB) variable clock signal, 800 MHz |
| intermediate (SSB) variable clock rate Ffvclk, 800 MHz + Δf |
| offset high fixed clock signal |
| offset high fixed clock rate Foclk, 12.0 GHz |
| high fixed clock signal |
| high fixed clock rate Fhclk, 12.8 GHz |
| high (SSB) variable clock signal |
| high (SSB) variable clock rate Fhvclk, 12.8 GHz + Δf |

The high variable clock signal and the intermediate variable clock signal are two embodiments of a single sideband (SSB) variable clock signal; and the intermediate variable clock rate Ffvclk and high variable clock rate Fhvclk are two embodiments of an SSB variable clock rate for the present invention. The high fixed clock rate Fhclk is the sum or difference (preferably the sum) of the intermediate fixed clock rate Ffclk and the offset high fixed clock rate Foclk.

Single Loop in Signal Switching Path

The signal switching path is the path where the frequency of the signal must be switched in order to change the output frequency. The signals in the signal switching path must have fast switching in order to provide fast switching in the output frequency. The signal switching path of the present invention includes the dual seed calculator 12, clock rate interpolator 36, the SSB upconverter 38, 38A, the accumulator 16 and the tracking filter 18. The base clock generator 32, 32A and the rate upconverter 34, 34A are not part of the signal switching path.

The tracking filter 18 is implemented as the phase lock loop 22 and the rate upconverter 34, 34A is implemented as the phase lock loop 52, 52A. The phase lock loop 52, 52A for generating the high fixed clock signal or offset high fixed clock signal is not in the signal switching path. The phase lock loop 22 is the only phase lock loop in the signal switching path of the present invention. Therefore, the apparatus of the present invention is termed a single loop synthesizer. The significance of whether a phase lock loop is in the signal switching path is that phase lock loops in the signal switching path inevitability degrade the switching speed; and require more cost, size and power in order to minimize that degradation, than a loop that is not in the signal switching path. The frequency synthesizer 10 has a switching time less than ten microseconds for phase settling within one-tenth radian.

The clock rate interpolator 36 uses direct digital synthesis from the frequency Fdclk of the dds fixed clock signal and the second seed word L for synthesizing the baseband variable clock signal at the Δf rate. The direct digital synthesis uses a numerically controlled oscillator (NCO) and a digital-to analog converter (DAC). The NCO generates a digital signal by continuously adding a digital word for providing a repeating digital staircase that starts over when it overflows and the DAC converts the digital signal to an analog signal without the use of phase or frequency comparison for a feedback loop.

The sine and cosine DDS 62 and 64 generate close-in spurious signals that may not be filtered by the tracking filter 18 in order that the tracking filter 18 have sufficient bandwidth for fast switching. However, the relatively low frequency operation of these circuits allow direct digital synthesis techniques to be used at a relatively low cost for ensuring that spurious signal levels are low with respect to the baseband variable clock signal at the Δf rate. The spurious levels in the baseband variable clock signal are effectively translated to spurious level of the synthesizer 10 output signal by the factor of the output frequency Fout divided by the high fixed clock rate Fhclk.

Calculating the First Seed Word K and Resolution ΔK

The desired output frequency Fout is synthesized from the calculated first and second seed words K and L, respectively, and several constants in the design of the frequency synthesizer 10. The first seed word K sets the coarse frequency resolution and the second seed word L sets the fine frequency resolution. The dual seed calculator 12 calculates (uses equations or a table look up based on a previous calculation or a combination of equations and table lookup) the first and second seed words K and L based on the desired output frequency Fout and several system constants of the frequency synthesizer 10 in order to provide the desired output frequency Fout.

An equation 1 shows a calculation of the first seed word K as a function of the desired output frequency Fout, the high modulus $2^M$ for the accumulator 16, the upconversion factor or ratio C between the MSB cycle frequency and the desired output frequency Fout, and the high fixed clock rate Fhclk, where the high fixed clock rate Fhclk is one fixed clock rate or a combination of fixed clock rates.

$$K=(Fout/C)*2^M/Fhclk \qquad 1$$

An equation 2 shows a calculation of the first seed word K as an integer with a selected incremental resolution ΔK.

$$K=\text{integer}\{[(Fout/C)*(2^M/Fhclk)+\Delta K/2]/\Delta K\}*\Delta K \qquad 2$$

In the equation 2, K is the first seed word as an integer; ΔK is the incremental resolution of the first seed word K; Fhclk is the high fixed clock rate; $2^M$ is the high modulus; Fout is the output frequency; and C is the frequency upconversion factor or ratio from the MSB cycle frequency to the output frequency Fout. The term ΔK/2 is used for centering the first seed word K.

The integer resolution ΔK is selected based on a desired spectral separation ΔSS between the average frequency of the MSB cycle reference word signal and the spurious frequencies due to the phase steps of the MSB cycle reference word signal. An equation 3 shows a selection for the integer resolution ΔK as a function of the minimum spectral separation ΔSS.

$$\Delta K=\Delta SS*2^M/Fhclk \qquad 3$$

In the equation 3, ΔK is the incremental resolution of the first seed word K; ΔSS is a minimum spectral separation; Fhclk is the high fixed clock rate; and $2^M$ is the high modulus.

The resolution ΔK is rounded to a power of two. In a preferred embodiment the high modulus $2^M$ is 220 for M=twenty bits of accumulation for the reference word and the resolution ΔK is 2048 or $2^{11}$. In a preferred embodiment the first seed word K has a range of 102400 to 204800 for a desired output frequency Fout of 5000 to 10000 MHz, a frequency upconversion ratio C of four and a high fixed clock rate Fhclk of 12.8 GHz.

Calculating the Second Seed Word L

The clock rate interpolator 36 operates with a dds modulus $2^{Mb}$ corresponding to Mb bits. The clock interpolation rate Δf provided by the clock rate interpolator 36 is a function of the second seed word L, the dds modulus $2^{Mb}$ and the dds fixed clock rate Fdclk. An equation 4 transposes the function to show the calculation of the second seed word L as a function of the clock interpolation rate Δf, the dds modulus $2^{Mb}$ and the dds fixed clock rate Fdclk.

$$L=\Delta f*2^{Mb}/Fdclk \qquad 4$$

An equation 5 shows the desired output frequency Fout is a function of the upconversion factor C, the high fixed clock rate Fhclk, the clock interpolation rate Δf, the first seed word K, and the high modulus $2^M$ where the high fixed clock rate Fhclk is one fixed clock rate or a combination of fixed clock rates.

$$Fout=C*(Fhclk+\Delta f))*K/2^M- \qquad 5$$

Combining the equations 4 and 5 results in an equation 6 for calculating the second seed word L.

$$L=[(Fout/C*2^M/K)-Fhclk](2^{Mb}/Fdclk) \qquad 6$$

In the equation 6, L is the second seed word; Fout is the output frequency; K is the first seed word; Fhclk is the high fixed clock rate; Fdclk is the dds fixed clock rate; $2^{Mb}$ is the dds modulus; $2^M$ is the high modulus and C is a frequency upconversion ratio from the MSB overflow frequency to the output frequency Fout. It should be noted that the clock interpolation rate Δf is effectively plus or minus according to the plus or minus of the I (sine) component of an IQ variable clock signal. In the exemplary preferred embodiment described above, the clock interpolation rate Δf has a maximum range ΔF of ±125 MHz.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A frequency synthesizer, comprising:
an accumulator for accumulating a first seed word, said first seed word based on a desired output frequency, at a high variable clock rate starting from a remainder word for updating a reference word at an output of the accumulator at said high variable clock rate, said reference word having a most significant bit (MSB) and less significant bits (LSB)s, said remainder word corresponding to said LSBs at overflows of said MSB;

a tracking filter for receiving an MSB signal, said MSB signal corresponding to changes in said MSB, and issuing a filtered output signal having an actual output frequency based on a frequency of said MSB signal; and a variable rate clock generator for providing said high variable clock rate at a combination of at least one fixed clock rate and a clock interpolation rate, said clock interpolation rate responsive to a second seed word, said second seed word based on said desired output frequency.

2. The frequency synthesizer of claim 1, wherein:
the variable rate clock generator includes a clock rate interpolator using said second seed word for generating a baseband variable clock signal at a clock interpolation rate, and a single sideband (SSB) upconverter using at least one fixed clock signal having a fixed clock rate for frequency upconverting said baseband variable clock signal to a single sideband (SSB) variable clock signal having an SSB variable clock rate differing from said fixed clock rate by said clock interpolation rate.

3. The frequency synthesizer of claim 2, wherein:
said clock rate interpolator includes an IQ direct digital synthesizer using said second seed word for synthesizing said baseband variable clock signal as an IQ variable clock signal at said clock interpolation rate; and said SSB upconverter includes an IQ modulator for IQ modulating said fixed clock signal with said IQ variable clock signal for providing said SSB variable clock signal.

4. The frequency synthesizer of claim 3, wherein:
said SSB variable clock rate is said high variable clock rate.

5. The frequency synthesizer of claim 3, wherein:
said SSB upconverter includes said IQ modulator for modulating an intermediate said fixed clock signal having an intermediate said fixed clock rate with said IQ variable clock signal for providing said SSB variable clock signal; and a high offset upconverter using an offset high said fixed clock signal at an offset high said fixed clock rate for frequency upconverting said SSB variable clock signal to a high variable clock signal having said high variable clock rate, said high variable clock rate differing from a combination of said intermediate fixed clock rate and said offset high fixed clock rate by said clock interpolation rate.

6. The frequency synthesizer of claim 3, wherein:
said IQ modulator includes a scalar detector for detecting scalar amplitudes of said SSB variable clock signal; and a suppression algorithm for using said scalar amplitudes for controlling compensation circuitry for suppressing signals having rates other than said SSB variable clock rate.

7. The frequency synthesizer of claim 6, wherein:
said compensation circuitry includes a carrier leak compensator for suppressing feedthrough of said fixed clock signal into said SSB variable clock signal, and quadrature and ratio adjusters for suppressing double sideband conversion of said baseband variable clock signal to said SSB variable clock signal.

8. A frequency synthesizer, comprising:
an accumulator for accumulating a first seed word at a high variable clock rate starting from a remainder word for updating a reference word at an output of the accumulator at said high variable clock rate, said reference word having a most significant bit (MSB) and less significant bits (LSB)s, said remainder word corresponding to said LSBs at overflows of said MSB;

a tracking filter for receiving an MSB signal, said MSB signal corresponding to changes in said MSB, and issuing a filtered output signal having an actual output frequency based on a frequency of said MSB signal; and a seed calculator for providing said first seed word based on a desired output frequency.

9. The frequency synthesizer of claim 8, wherein:
the accumulator operates according to a modulus of the accumulator for providing said MSB; and
said first seed word is generated according to:

$$K=\text{integer}\{[(Fout/C)*(2^M/Fhclk)+\Delta K/2]/\Delta K\}*\Delta K$$

where K is said first seed word as an integer; $\Delta K$ is an incremental resolution of said first seed word K; Fhclk is a high fixed clock rate of one fixed clock rate or a combination of fixed clock rates; $2^M$ is said accumulator modulus; Fout is said desired output frequency; and C is a frequency ratio of said actual output frequency to said MSB signal frequency.

10. The frequency synthesizer of claim 8, further comprising:
a variable rate clock generator for providing said high variable clock rate differing from a high fixed clock rate by a clock interpolation rate, where said high fixed clock rate is one fixed clock rate or a combination of fixed clock rates; wherein
the variable rate clock generator includes a direct digital synthesizer for synthesizing said clock interpolation rate from a second seed word, and
the seed calculator is a dual seed calculator for providing said second seed word based on said first seed word and said desired output frequency.

11. The frequency synthesizer of claim 10, wherein:
said direct digital synthesizer uses a direct digital synthesis (dds) fixed clock rate and a dds modulus for providing said clock interpolation rate; and
said second seed word is generated according to:

$$L=[(Fout/C*2^M/K)-Fhclk](2^{Mb}/Fdclk)$$

where L is said second seed word; Fout is said desired output frequency; K is said first seed word; Fhclk is said high fixed clock rate; the $2^M$ is a modulus of the accumulator; the $2^{Mb}$ is said dds modulus; the Fdclk is said dds fixed clock rate; and C is a frequency ratio of said actual output frequency to said MSB signal frequency.

12. The frequency synthesizer of claim 8, further comprising:
a variable rate clock generator including a clock rate interpolator for generating said clock interpolation rate from a second seed word, said second seed word based on said desired output frequency, and a frequency upconverter for using at least one fixed clock rate for frequency upconverting said clock interpolation rate to said high variable clock rate.

13. The frequency synthesizer of claim 12, wherein:
said frequency upconverter includes an IQ modulator for IQ modulating a fixed clock signal having said fixed clock rate with a baseband variable clock signal having said clock interpolation rate for providing a single sideband (SSB) variable clock signal having an SSB variable clock rate differing from said fixed clock rate by said interpolation clock rate and using said SSB variable clock signal for providing a high variable clock signal at said high variable clock rate.

14. A method for synthesizing a frequency, comprising:
accumulating a first seed word, said first seed word based on a desired output frequency, at a high variable clock rate starting from a remainder word for updating a reference word at an output of an accumulator at said high variable clock rate, said reference word having a most significant bit (MSB) and less significant bits (LSB)s;
retaining said LSBs at overflows of said MSB as said remainder word;
issuing an MSB signal corresponding to changes in said MSB;
providing a filtered output signal having an actual output frequency based on a frequency of said MSB signal; and
generating said high variable clock rate at a combination of at least one fixed clock rate and a clock interpolation rate, said clock interpolation rate responsive to a second seed word, said second seed word based on said desired output frequency.

15. The method of claim 14, wherein:
providing said filtered output signal includes controlling said actual output frequency according to a phase difference between a phase of said MSB signal and a phase derived from said output signal.

16. The method of claim 15, wherein:
providing said filtered output signal further includes dividing said actual output frequency by a divide factor for providing said actual output frequency at said MSB signal frequency multiplied by said divide factor.

17. The method of claim 14, further comprising:
generating a baseband variable clock signal at a clock interpolation rate based on said second seed word; and
using at least one fixed clock signal having a fixed clock rate for frequency upconverting said baseband variable clock signal to a single sideband (SSB) variable clock signal having an SSB variable clock rate differing from said fixed clock rate by said clock interpolation rate.

18. The method of claim 17, wherein:
generating said baseband variable clock signal includes using said second seed word for synthesizing said baseband variable clock signal as an IQ variable clock signal having said clock interpolation rate; and
frequency upconverting said baseband variable clock signal includes IQ modulating said fixed clock signal with said IQ variable clock signal for providing said SSB variable clock signal.

19. The method of claim 17, wherein:
said SSB variable clock rate is said high variable clock rate.

20. The method of claim 18, wherein:
frequency upconverting said baseband variable clock signal includes IQ modulating an intermediate said fixed clock signal having an intermediate fixed clock rate with said IQ variable clock signal for providing said SSB variable clock signal, and using an offset high said fixed clock signal at an offset high fixed clock rate for frequency upconverting said SSB variable clock signal to a high variable clock signal having said high variable clock rate differing from a combination of said intermediate fixed clock rate and said offset high fixed clock rate by said clock interpolation rate.

21. The method of claim 18, further comprising:
detecting scalar amplitudes of said SSB variable clock signal; and
using said scalar amplitudes for suppressing signals having rates other than said SSB variable clock rate.

22. The method of claim 21, wherein:
suppressing signals includes suppressing feedthrough of said fixed clock signal into said SSB variable clock signal, and suppressing double sideband conversion from said baseband variable clock signal to said SSB variable clock signal.

23. A method for synthesizing a frequency, comprising:
accumulating a first seed word at a high variable clock rate starting from a remainder word for updating a reference word at an output of an accumulator at said high variable clock rate, said reference word having a most significant bit (MSB) and less significant bits (LSB)s;
retaining said LSBs at overflows of said MSB as said remainder word;
issuing an MSB signal corresponding to changes in said MSB;
providing a filtered output signal having an actual output frequency based on a frequency of said MSB signal; and
generating said first seed word based on a desired said output frequency.

24. The method of claim 23, wherein:
accumulating said first seed word includes operating according to a modulus of the accumulator for providing said MSB; and
said first seed word is generated according to:

$$K=\text{integer}\{[(Fout/C)*(2^M/Fhclk)+\Delta K/2]/\Delta K\}*\Delta K$$

where K is said first seed word as an integer; $\Delta K$ is an incremental resolution of said first seed word K; Fhclk is a high fixed clock rate at one fixed clock rate or a combination of fixed clock rates; $2^M$ is said accumulator modulus; Fout is said desired output frequency; and C is a frequency ratio of said desired output frequency Fout to said MSB signal frequency.

25. The method of claim 23, further comprising:
generating said high variable clock rate at a combination of a high fixed clock rate and a clock interpolation rate, where said high fixed clock rate is one fixed clock rate or a combination of fixed clock rates;
synthesizing said clock interpolation rate from a second seed word; and
generating said second seed word based on said first seed word and said desired output frequency.

26. The method of claim 25, wherein:
generating said second seed word is further based on a direct digital synthesis (dds) fixed clock rate and a dds modulus according to:

$$L=[(Fout/C*2^M/K)-Fhclk](2^{Mb}/Fdclk)$$

where L is said second seed word; Fout is said desired output frequency; K is said first seed word; Fhclk is said high fixed clock rate; the $2^M$ is a modulus of the accumulator; the $2^{Mb}$ is said dds modulus; the Fdclk is said dds fixed clock rate; and C is a frequency ratio of said desired output frequency Fout to said MSB signal frequency.

27. The method of claim 23, further comprising:
generating a clock interpolation rate from a second seed word, said second seed word based on said desired output frequency; and
using at least one fixed clock rate for frequency upconverting said clock interpolation rate to said high variable clock rate.

28. The method of claim 27, wherein:
IQ modulating a fixed clock signal having said fixed clock rate with a baseband variable clock signal having said clock interpolation rate for providing a single sideband (SSB) variable clock signal having an SSB variable clock rate differing from said fixed clock rate by said interpolation clock rate; and using said SSB variable clock signal for providing a high variable clock signal at said high variable clock rate.

* * * * *